US011275999B2

(12) United States Patent
Park et al.

(10) Patent No.: US 11,275,999 B2
(45) Date of Patent: Mar. 15, 2022

(54) NEURAL NETWORKS USING CROSS-POINT ARRAY AND PATTERN READOUT METHOD THEREOF

(71) Applicant: Seoul National University R&DB FOUNDATION, Seoul (KR)

(72) Inventors: Byung-Gook Park, Seoul (KR); Min-Hwi Kim, Seoul (KR); Sungjun Kim, Seoul (KR)

(73) Assignee: Seoul National University R&DBFoundation, Seoul (KR)

( * ) Notice: Subject to any disclaimer, the term of this patent is extended or adjusted under 35 U.S.C. 154(b) by 0 days.

(21) Appl. No.: 16/197,651

(22) Filed: Nov. 21, 2018

(65) Prior Publication Data

US 2019/0156208 A1 May 23, 2019

(30) Foreign Application Priority Data

Nov. 23, 2017 (KR) ........................ 10-2017-0156966

(51) Int. Cl.
*G06N 3/063* (2006.01)
*G06N 3/08* (2006.01)
*G11C 11/54* (2006.01)
*H01L 27/24* (2006.01)
(Continued)

(52) U.S. Cl.
CPC ............... *G06N 3/08* (2013.01); *G06N 3/063* (2013.01); *G06N 3/0635* (2013.01); *G11C 11/54* (2013.01); *G11C 13/003* (2013.01); *G11C 13/004* (2013.01); *G11C 13/0007* (2013.01); *G11C 13/0023* (2013.01); *H01L 27/2463* (2013.01); *H01L 45/1233* (2013.01); *H01L 45/1253* (2013.01); *H01L 45/145* (2013.01); *H01L 45/146* (2013.01); *G11C 2013/005* (2013.01);
(Continued)

(58) Field of Classification Search
CPC ........ G06N 3/08; G06N 3/0635; G06N 3/063; G06N 3/0454; G11C 13/0023; G11C 13/003; G11C 13/0007; G11C 13/004; G11C 11/54; G11C 2213/77; G11C 2213/71; G11C 2213/32; G11C 2013/005; H01L 45/145; H01L 45/146; H01L 45/1253; H01L 45/1233; H01L 27/2463
See application file for complete search history.

(56) References Cited

U.S. PATENT DOCUMENTS 7,763,978 B2 * 7/2010 Wu ........................ B82Y 10/00 257/758
8,487,450 B2 * 7/2013 Mouli ................ G11C 13/0002 257/30
(Continued)

FOREIGN PATENT DOCUMENTS

KR 10-1257365 4/2013
KR 10-1425857 7/2014

*Primary Examiner* — Khamdan N. Alrobaie
(74) *Attorney, Agent, or Firm* — Gerald E. Hespos; Michael J. Porco; Matthew T. Hespos

(57) ABSTRACT

A neural network using a cross-point array is provided along with a pattern readout method thereof. Resistive memory devices are stacked vertically to form the neural network as synaptic devices. The connection strength of the signal passing between two neurons is controlled by the positive and negative conductance of the resistive memory devices and it is possible to recognize and readout patterns by learning in the cross-point array.

6 Claims, 6 Drawing Sheets

(51) Int. Cl.
*H01L 45/00* (2006.01)
*G11C 13/00* (2006.01)

(52) U.S. Cl.
CPC ...... *G11C 2213/32* (2013.01); *G11C 2213/71* (2013.01); *G11C 2213/77* (2013.01)

(56) References Cited

U.S. PATENT DOCUMENTS 8,724,369 B2 * 5/2014 Zhang ................ G11C 13/0007 365/148
9,053,766 B2 * 6/2015 Yan ........................ G11C 5/025
9,065,044 B2 * 6/2015 Scheuerlein ....... G11C 13/0002
9,117,513 B2 8/2015 Hwang et al.
9,136,468 B2 * 9/2015 Nakai ..................... H01L 45/06
9,165,242 B2 10/2015 Park et al.
9,208,869 B2 12/2015 Hwang et al.
9,214,631 B2 12/2015 Hwang et al.
10,127,494 B1 * 11/2018 Cantin ................. G06N 3/0445
10,418,417 B1 * 9/2019 Oh ......................... G06N 3/063
2008/0296550 A1 * 12/2008 Lee ..................... H01L 27/2409 257/2
2009/0095985 A1 * 4/2009 Lee .................... G11C 13/0007 257/211
2012/0084240 A1 * 4/2012 Esser ..................... G06N 3/063 706/27
2013/0021835 A1 1/2013 Hwang et al.
2013/0073497 A1 * 3/2013 Akopyan ............... G06N 3/049 706/27
2014/0067743 A1 3/2014 Park et al.
2015/0076668 A1 * 3/2015 Shih .................. H01L 21/76883 257/623
2015/0318041 A1 11/2015 Hwang et al.
2015/0318474 A1 11/2015 Hwang et al.
2015/0357342 A1 * 12/2015 Lee ................... H01L 29/40117 257/324
2016/0064453 A1 * 3/2016 Hou .................... H01L 27/2481 257/4
2019/0131523 A1 * 5/2019 Park .................... H01L 45/1226
2019/0354843 A1 * 11/2019 Park ................... G11C 13/0023
2020/0034686 A1 * 1/2020 Chiu .................... G06N 3/0635
2021/0004174 A1 * 1/2021 Boniardi ............. H01L 27/2463
2021/0104276 A1 * 4/2021 Boniardi ................ G06N 3/063

* cited by examiner

FIG. 5
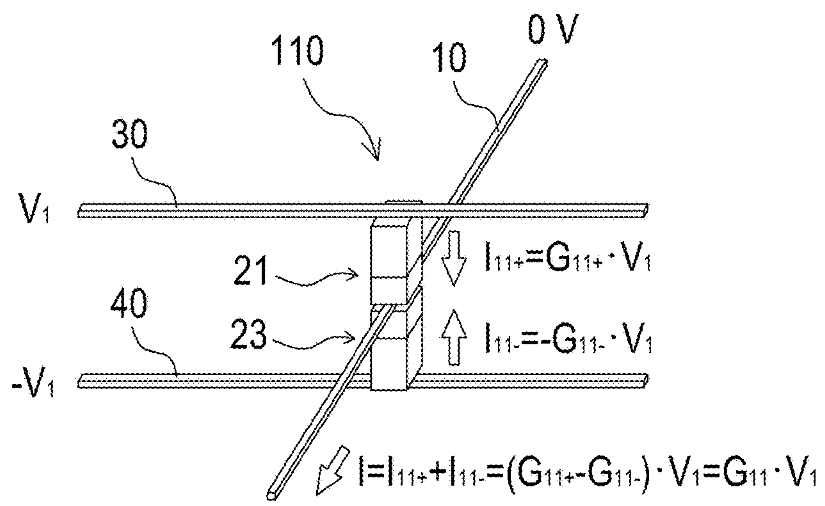
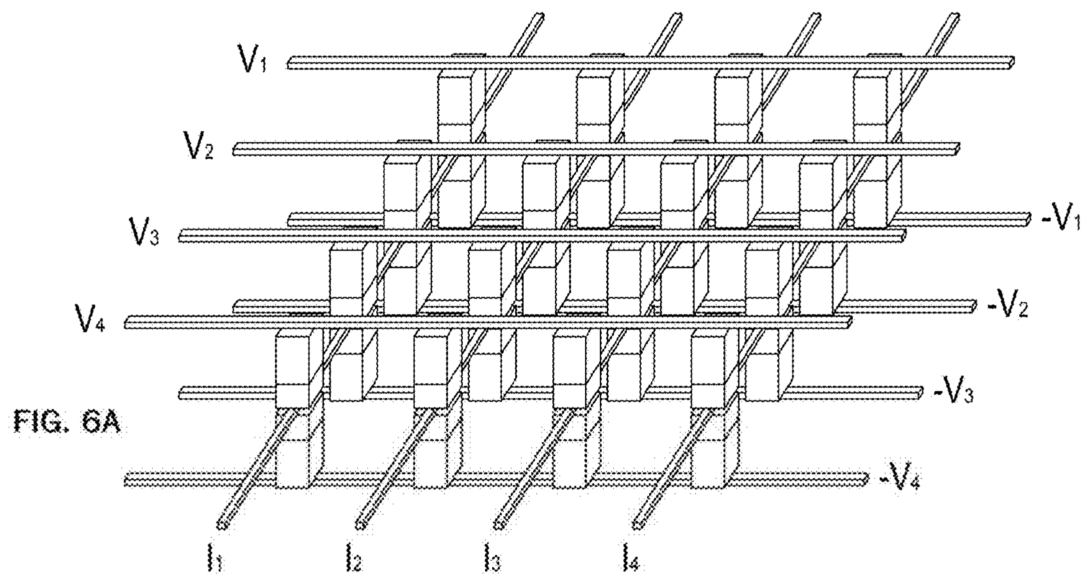
FIG. 6A
FIG. 6B
$$I_1=G_{11}\cdot V_1+G_{21}\cdot V_2+G_{31}\cdot V_3+G_{41}\cdot V_4$$
$$I_2=G_{12}\cdot V_1+G_{22}\cdot V_2+G_{32}\cdot V_3+G_{42}\cdot V_4$$
$$I_3=G_{13}\cdot V_1+G_{23}\cdot V_2+G_{33}\cdot V_3+G_{43}\cdot V_4$$
$$I_4=G_{14}\cdot V_1+G_{24}\cdot V_2+G_{34}\cdot V_3+G_{44}\cdot V_4$$

210 220 230

$$\begin{pmatrix} I_1 \\ I_2 \\ I_3 \\ I_4 \end{pmatrix} = \begin{pmatrix} G_{11} & G_{21} & G_{31} & G_{41} \\ G_{12} & G_{22} & G_{32} & G_{42} \\ G_{13} & G_{23} & G_{33} & G_{43} \\ G_{14} & G_{24} & G_{34} & G_{44} \end{pmatrix} \begin{pmatrix} V_1 \\ V_2 \\ V_3 \\ V_4 \end{pmatrix}$$

FIG. 9
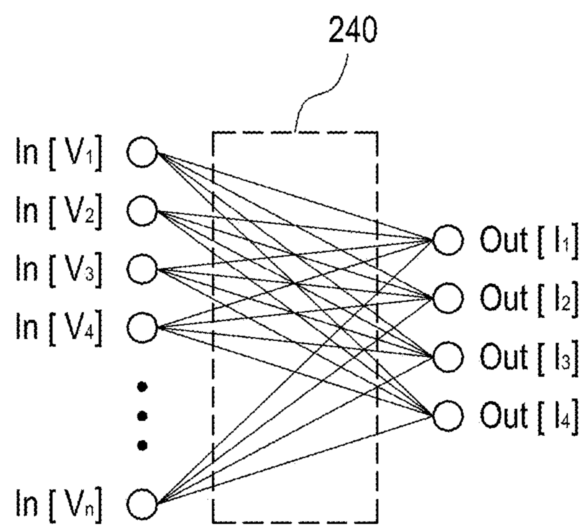
FIG. 10
210 240 250
$$\begin{pmatrix} I_1 \\ I_2 \\ I_3 \\ I_4 \end{pmatrix} = \begin{pmatrix} G_{11} & G_{21} & G_{31} & \cdots & G_{n1} \\ G_{12} & G_{22} & G_{32} & \cdots & G_{n2} \\ G_{13} & G_{23} & G_{33} & \cdots & G_{n3} \\ G_{14} & G_{24} & G_{34} & \cdots & G_{n4} \end{pmatrix} \begin{pmatrix} V_1 \\ V_2 \\ V_3 \\ \vdots \\ V_n \end{pmatrix}$$
FIG. 11
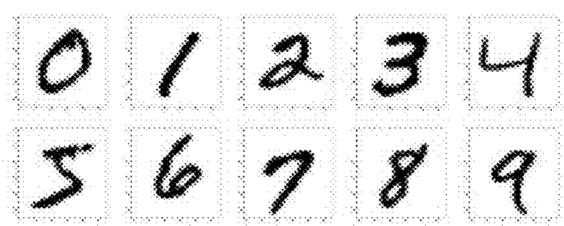

NEURAL NETWORKS USING CROSS-POINT ARRAY AND PATTERN READOUT METHOD THEREOF

CROSS-REFERENCE TO RELATED APPLICATION

This application claims priority to Korean Patent Application No. 10-2017-0156966, filed on Nov. 23, 2017, under 35 U.S.C. 119, the entire contents of which are hereby incorporated by reference.

BACKGROUND OF INVENTION

Field of the Invention

The present invention relates to an artificial neural network for implementing a neuromorphic system, and more particularly to a neural network using a cross-point array and a pattern readout method thereof.

Cross-point arrays are widely used in resistive random access memory (RRAM) arrays and the like. In particular, as shown in FIG. 1, because the RRAM is made of a metal-insulator-metal (MIM) material, has a simple structure and is not limited to device miniaturization, it has been many studied as a next-generation memory.

The switching operation of the RRAM is divided into three phases: as shown in FIG. 2, a forming process for forming a conductive filament in an initial state to be a low resistance state, a reset operation for increasing the resistance of the conductive filament by breaking the conductive filament, and a set operation to be the low resistance state again. The forming process is the first operation of the set operation and requires a higher voltage.

As one of the read methods of the RRAM array, 'V/2 method' is used as shown in FIG. 3. That is, a voltage of V is applied to the bit line 200, which is the top electrode of the cell 300 to be read, and 0 V is applied to the word line 100 of the bottom electrode. The other cells 410, 420, 430, and 440 sharing the lines 100 and 200 are applied with only ½ V between the top and bottom electrodes. However, when the cell 300 selected for reading is in the high resistance state (HRS), the leakage current (the dashed line in FIG. 3) caused by the adjacent cells 430 and 440 is detected together with the current of the selected cell (the solid line in FIG. 3). The leakage current of these adjacent cells 430 and 440 has been the cause of errors in the read operation and limited the size of the array. Thus, one of the challenges of RRAM arrays is to reduce the leakage current from these unselected cells (see Korean Patent No. 10-1257365).

On the other hand, in order to implement the neuromorphic system, it is essential to develop arrays that can simulate many connections between neurons as well as the development of synaptic devices. Particularly, since human neurons are about 100 billion and connect to 1,000 synapses per neuron, an array of about 100 trillion synaptic mimic elements must be constructed to implement a human neuromorphic system.

One of the characteristics of biological synapses is that the synaptic connectivity is potentiated or depressed according to the difference in fire time between pre- and post-neuron synapses (see Korean Patent No. 10-1425857). For such characteristics, it is necessary to reflect the positive and negative conductance in the neuromorphic system, but it has not yet been attempted.

SUMMARY OF THE INVENTION

The present invention is to utilize the leakage current, which is pointed out as a problem in the conventional RRAM array, in reverse, and the resistive memory device having several states of resistance through progressive resistance change operation in addition to two states of low resistance state and high resistance state. The resistive memory devices are stacked vertically to form a neural network as synaptic devices. The connection strength of the signal passing between two neurons is controlled by the positive and negative conductance and it is possible to recognize patterns by learning in a cross-point array of the present invention.

To achieve the objectives, a neural network according to the present invention is composed of a plurality of synaptic devices, wherein the neural network has a cross-point array vertically stacked with a plurality of conductive lines intersecting each other, wherein the conductive lines are stacked in three or more layers, and wherein the synaptic devices are arranged symmetrically with one of the conductive lines disposed therebetween.

The conductive lines may be divided into three layers of a lower layer, an intermediate layer and an upper layer. A plurality of lower word lines may be arranged in the lower layer. A plurality of bit lines may be arranged to be perpendicular to the lower word lines in the intermediate layer. And a plurality of upper word lines may be arranged in parallel with the lower word lines in the upper layer.

The synaptic devices may be resistive memory devices having top and bottom electrodes, the top and bottom electrodes being the conductive lines intersecting up and down, and the resistive memory devices may comprise one or more resistance change material layers between the conductive lines intersecting up and down.

The resistance change material layers may comprise a silicon nitride film and at least one of a silicon oxide film, an aluminum oxide film and a hafnium oxide film stacked on the upper or lower portion of the silicon nitride film.

A pattern readout method of the neural network according to the present invention comprises steps of: inputting each of the upper word lines as a voltage vector component; inputting each of the lower word lines as an opposite polarity voltage vector component having the same magnitude as the voltage vector component applied to each of the upper word lines connected in a stack of the resistive memory devices; and reading the bit lines and outputting a current vector to recognize a predetermined pattern, the current vector being obtained by an inner product multiplying a conductance matrix of the resistive memory devices constituting the synaptic devices by a voltage vector constituted by the voltage vector component.

Voltages of pixels constituting the pattern may be decomposed into a one-dimensional voltage vector, the one-dimensional voltage vector applying to each of the upper word lines as the voltage vector component. Each of the lower word lines may be applied with an opposite polarity voltage vector component having the same magnitude as the voltage vector component applied to each of the upper word lines connected in a stack of the resistive memory devices. The bit lines may be grounded for learning to effect conductance of the resistive memory devices constituting the synaptic devices. And the result of the learning may be reflected in the conductance matrix of the resistive memory devices.

The present invention is based on the idea that resistive memory devices are vertically stacked in a cross-point array as synaptic device to form a neural network. The connection strength of the signal passing between two neurons is controlled by positive and negative conductance of the resistive memory devices. And it is possible to recognize and readout patterns by learning in the cross-point array and to implement a neuromorphic system with a minimal area.

BRIEF DESCRIPTION OF THE DRAWINGS

FIG. 5 is a diagram showing the principle of applying positive and negative polarity voltages to the upper and lower word lines and grounding bit lines to realize positive and negative synapse conductance in a neural network using a cross-point array according to an embodiment of the present invention.

FIG. 6A is a conceptual diagram of a neural network using a cross-point array according to an embodiment of the present invention, and FIG. 6B is simultaneous equations showing that the output current vector components of bit lines can be calculated on the principle shown in FIG. 5.

FIG. 9 is a diagram showing a relationship between an input signal (n voltage vector components) and an output signal (4 current vector components) in another embodiment in which the upper and lower word lines are expanded to an arbitrary number (n) in FIG. 6A.

FIG. 10 shows that the output current vector (four components) of FIG. 9 is represented by an inner product of the conductance matrix (4×n) of the resistive memory devices and the input voltage vector (n components).

FIG. 11 is a view illustrating patterns 0 to 9 shown as two-dimensional pixels in a neural network using a cross-point array according to the present invention.

In these drawings, the following reference numbers are used throughout: reference number 10 indicates a bit line, 21 and 23 a resistive memory device, 22 a first resistance material layer, 24 a second resistance material layer, 30 an upper word line, 40 a lower word line, 110 a synaptic device, 210 a current vector, 220 and 240 a conductance matrix, and 230 and 250 a voltage vector.

DETAILED DESCRIPTION

Detailed descriptions of preferred embodiments of the present invention are provided below with accompanying drawings.

First, referring to FIGS. 5 and 6, a neural network using a cross-point array of the present invention will be described.

A neural network of the present invention is composed of a plurality of synaptic devices 110 and has a structure of a cross-point array vertically stacked with a plurality of conductive lines 10, 30, and 40 intersecting each other. Here, the conductive lines 10, 30, and 40 are stacked in three or more layers, and the synaptic devices 110 (21 and 23) are arranged symmetrically with one of the conductive lines (e.g., 10) disposed therebetween.

Figures 7, 8:
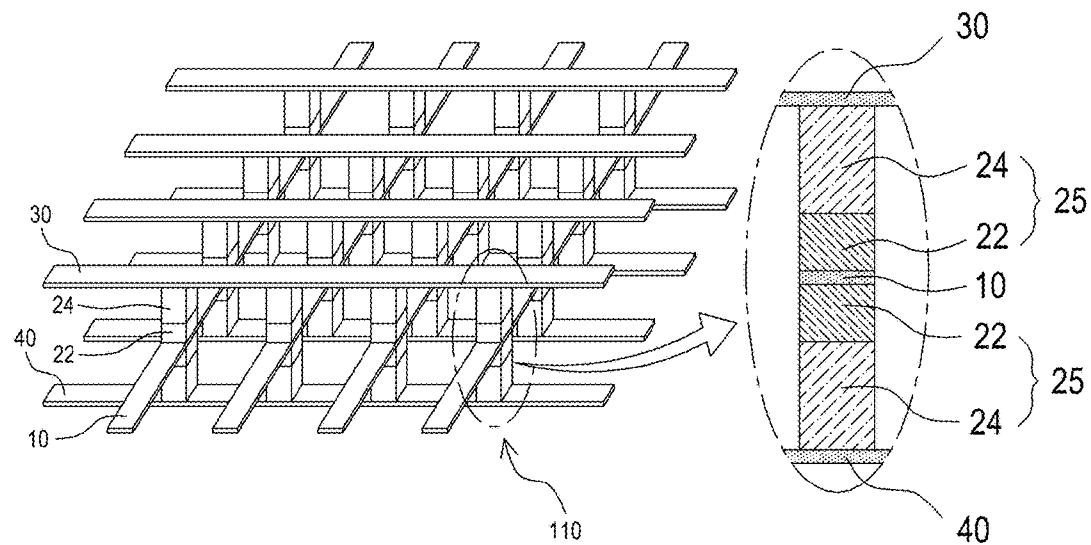
FIG. 7 shows that the output current vector is represented by an inner product of the conductance matrix of the resistive memory devices and the input voltage vector from the simultaneous equations of FIG. 6B.
FIG. 8 is a view showing an embodiment of FIG. 6A with an enlarged partial sectional view.

FIG. 6A is conceptually showing a neural network using a cross-point array according to an embodiment of the present invention which can be implemented as shown in FIG. 8.

In FIGS. 6A and 8, the conductive lines are divided into three layers of a lower layer, an intermediate layer and an upper layer. However, the conductive line layers may be vertically further stacked on the upper layer which is a third conductive line layer. Between the upper and lower conductive line layers additionally stacked on the third conductive line layer, another conductive line layer may intersect with them to form a plurality of cross points. And synaptic devices such as 21 and 23 may be further arranged at each of the cross points.

The synaptic devices may be made of various switching elements. However, it is preferable that resistive memory devices (RRAMs) having top and bottom electrodes are used as the synaptic devices 21 and 23. Here, the top and bottom electrodes of the resistive memory devices 21 and 23 may be made of the conductive lines 10 and 30 or 10 and 40 intersecting up and down.

The resistive memory devices 21 and 23 may include one or more resistance change material layers 25 between the conductive lines 10 and 30 or 10 and 40 that intersect up and down.

By the above configuration, it is possible to mimic a complex neural network having neurons as many as the number of human neurons, connecting the synaptic devices 21 and 23 in the minimum area $4F^2$ of the intersection.

The resistance change material layers 25 may be formed of one kind of resistance material layer or may be formed of two or more kinds of material layers. FIG. 8 shows an example in which the first resistive material layer 22 and the second resistive material layer 24 are laminated.

Figure 1:
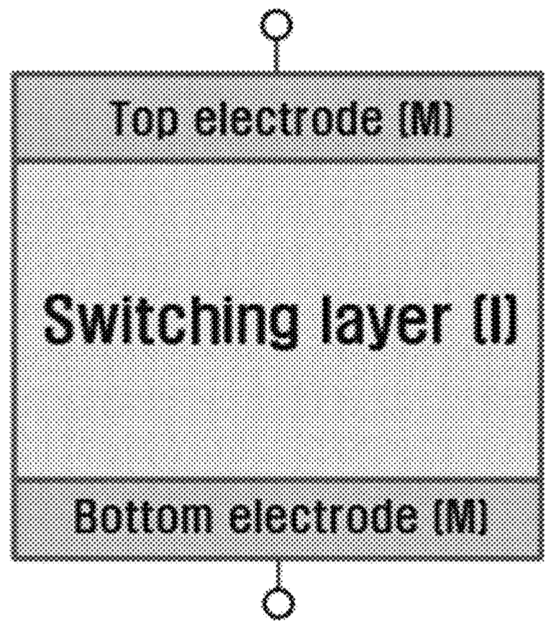
FIG. 1 is a cross-sectional view showing a basic structure of a conventional resistive memory device.
Figure 2:
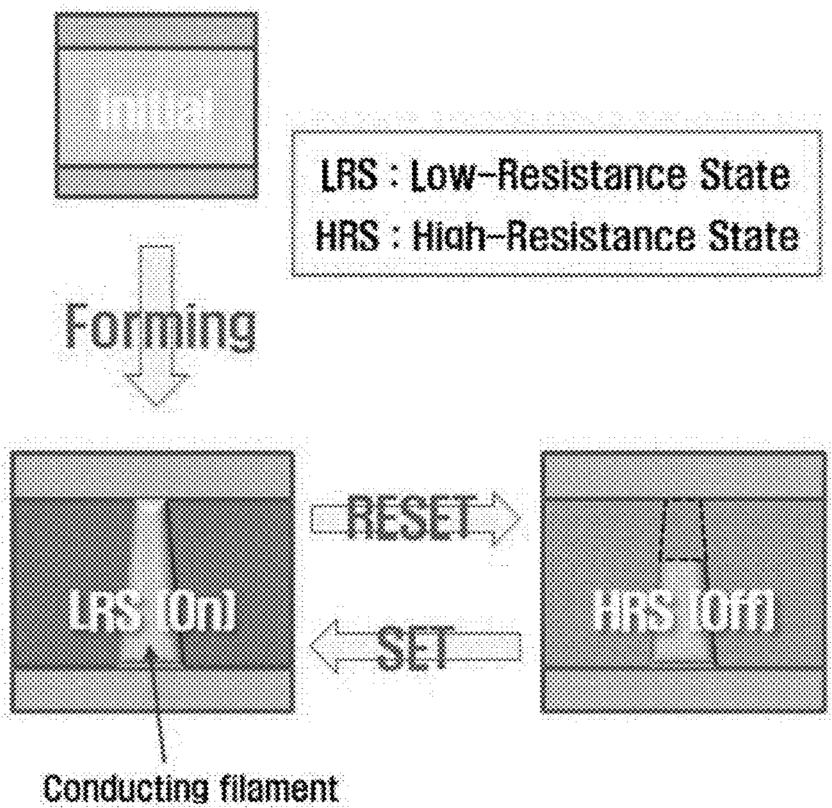
FIG. 2 is a conceptual diagram showing the switching operation characteristics of the resistive memory device having the structure of FIG. 1.
Figure 3:
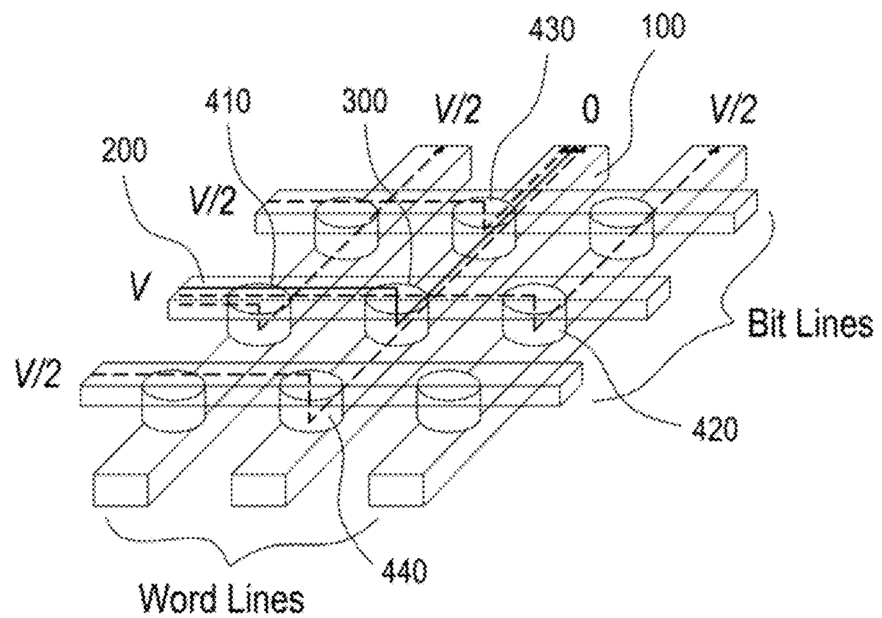
FIG. 3 is an operation diagram of a cross-point array. During the reading operation by a V/2 method, leakage currents of adjacent unselected cells are sensed together.
Figure 4:
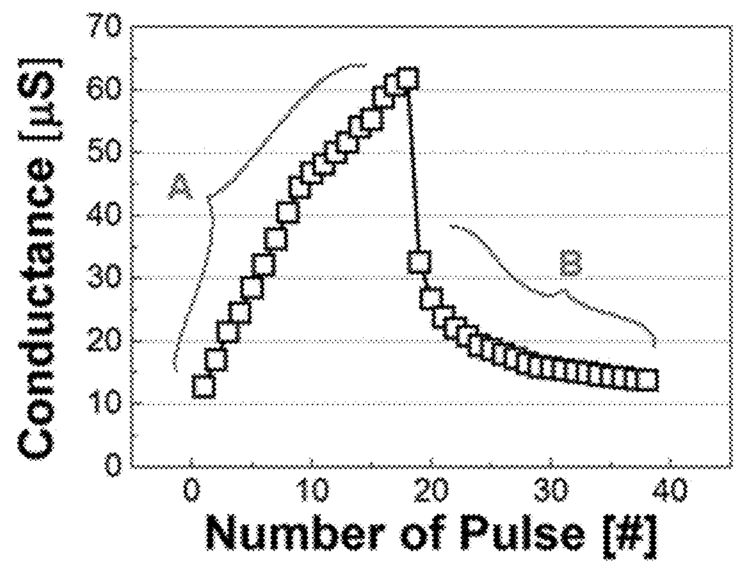
FIG. 4 is an electrical characteristic diagram showing a change in conductance according to continuous pulse application of a resistive memory device having a silicon nitride film and a silicon oxide film according to the present invention.

FIG. 4 is an electrical characteristic diagram showing a progressive change in conductance according to application signals (i.e., pulse voltages) of the embodiment in which the silicon nitride film 24 and the silicon oxide film 22 are laminated as the resistance change material layers 25 between the top and bottom electrodes 10 and 30 or 10 and 40 as shown in FIG. 8. A positive (+) pulse voltage having a constant size at intervals of 10 seconds is applied to the top and bottom electrodes 18 times, and the conductance is measured at each time. From the 19th time, a negative (−) pulse voltage of the same magnitude as the previous one is repeatedly applied, and the conductance is measured at each time as well.

Referring to FIG. 4, it is showing that the conductance gradually changes in both of sections A and B positively and negatively, respectively. In section A a positive (+) pulse voltage is applied, and in section B a negative (−) pulse voltage is applied. By confirming that the electrical characteristic of the resistive memory device is similar to that of the synapse, the resistive memory devices can be used as synaptic devices of the present invention and the characteristic of the synapse that the synaptic connectivity is strengthened or weakened can be reflected by the positive and negative conductance of the resistive memory devices. Thus, it is possible to implement a neuromorphic system by the present invention.

The synaptic device 110 according to the present invention may be implemented with one of the resistive memory devices 21 and 23 as described above. However, in order to have the positive and negative conductance, the synaptic device 110 is preferably configured with two resistive memory devices 21 and 23 arranged symmetrically with a conductive line 10 disposed therebetween in the vertical direction as shown in FIG. 5.

The resistance change material layers 25 may be formed of resistance variable material having traps and preferably include a nitride, particularly a silicon nitride film 24, which can form conduction paths without a separate foaming process. Thus, the resistance change material layers 25 may be constituted with a silicon nitride film 24 and a silicon oxide film 22 as shown in FIG. 8. Here, the silicon oxide film 22 may be replaced with an aluminum oxide film or a hafnium oxide film. Instead of the silicon nitride film 24, two or more of a silicon oxide film, an aluminum oxide film and a hafnium oxide film may be laminated.

The conductive lines 10, 30 and 40 may be formed of a metal such as W, Ni, Ti, or TiN. The conductive line 10 may be formed of n+ or p+ polycrystalline silicon (n+ or p+ doped poly-silicon) implanted with impurities because it is passing between two resistive memory devices 21 and 23 and is commonly used as a bottom electrode of the two resistive memory devices 21 and 23.

In another embodiment, the conductive line 10 commonly used as a bottom electrode of the two resistive memory devices 21 and 23 may be formed of a metal such as W, Ni, Ti, TiN, and the other conductive lines 30 and 40 passing both ends of the two resistive memory devices 21 and 23 as top electrodes of them may be formed of n+ or p+ polycrystalline silicon (n+ or p+ doped poly-silicon) doped with impurities.

More specifically, as shown in FIG. 8, the conductive lines may be divided into three layers of a lower layer, an intermediate layer, and an upper layer as described above. In the lower layer, a plurality of lower word lines 40 are disposed. In the intermediate layer, a plurality of bit lines 10 are arranged perpendicular to the lower word lines 40. And in the upper layer, a plurality of upper word lines 30 are arranged in parallel with the lower word lines 40.

Next, a pattern readout method of a neural network using a cross-point array of the present invention will be described with reference to FIGS. 5 and 6.

As shown in FIGS. 6A and 8, a plurality of conductive lines are divided into three layers to cross the upper and lower word lines 30 and 40 and the bit lines 10. The pattern readout method of the present invention will be described on the basis of the above embodiment.

The method for recognizing and readout of a predetermined pattern according to the embodiment includes steps of: inputting a voltage vector component (V1, V2, V3, V4) to each of the upper word lines 30. And inputting an opposite polarity voltage vector component (−V1, −V2, −V3, −V4) having the same magnitude as the voltage vector component applied to each of the upper word lines connected in a stack of the resistive memory devices to each of the lower word lines 40.

At this time, the current flowing through the grounded bit lines 10 can be obtained by the voltage-current simultaneous equations shown in FIG. 6B, and be represented with a current vector (I) 210 that is obtained by an inner product multiplying a conductance matrix (G) 220 of the upper and lower stacked resistive memory devices 21 and 23 by a voltage vector (V) 230 constituted by the voltage vector components as shown in FIG. 7.

Thus, the steps include reading the bit lines 10 and outputting a current vector (I) 210 to recognize a predetermined pattern.

The conductance matrix (G) 220 of the resistive memory devices 21 and 23 will include a negative conductance as well as a positive one as seen in FIG. 4.

The above embodiment may be more generalized so that when the upper word lines 30 are composed of n lines, a voltage vector component (V1, V2, V3, V4, Vn) is applied to each of the upper word lines 30 as shown in FIG. 9. The lower word lines 40 are applied with an opposite polarity voltage vector component (−V1, −V2, −V3, −V4, . . . , −Vn). The current flowing through the grounded four bit lines 10 is represented with a current vector (I) 210 having four components, which is obtained by an inner product multiplying a 4×n conductance matrix (G) 240 of the resistive memory devices and an input voltage vector (V) 250 having n components as shown in FIG. 10.

The pattern readout method of a neural network described above may use a result of learning in the same way. Thus, the learning method may be also implemented by the above-described pattern readout method.

For learning, voltages of pixels constituting a pattern to be recognized are decomposed into a one-dimensional voltage vector and input as a voltage vector component to each of the upper word lines 30, and the lower word lines 40 are applied with an opposite polarity voltage vector component having the same magnitude as the voltage vector component applied to each of the upper word lines connected in a stack of the resistive memory devices 21 and 23.

At this time, the bit lines 10 are grounded and the neural network is learned by a change in conductance of the upper and lower stacked resistive memory devices 21 and 23 constituting the synaptic device 110.

The result of the learning is reflected in the conductance matrix (G) of the resistive memory devices constituting the synaptic devices.

FIG. 11 shows patterns 0 to 9 having two-dimensional 28×28 pixels, respectively in a neural network of an embodiment that the upper and lower word lines 30 and 40 are composed of 784 and that the bit lines 10 are composed of 4.

Figure 12:
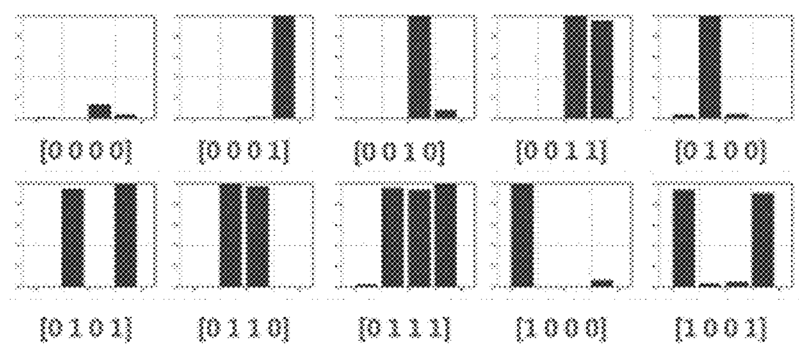
FIG. 12 is a view showing current vectors obtained in bit lines as pattern readout results in case that voltages of pixels constituting each pattern of FIG. 11 are decomposed into a one-dimensional voltage vector and input to the upper and lower word lines as a voltage vector component and an opposite polarity voltage vector component, respectively.

FIG. 12 is a view showing current vectors obtained in bit lines as pattern readout results of each pattern of FIG. 11. For learning, voltages of pixels constituting each pattern of FIG. 11 are decomposed into a one-dimensional voltage vector having 784 components and input to the upper and lower word lines as a voltage vector component (V1, V2, V3, V4, . . . , V784) and an opposite polarity voltage vector component (−V1, −V2, −V3, −V4, . . . , −V784), respectively, and the four bit lines are grounded. And for the pattern readout, when the voltages are applied to the upper and lower word lines in the same manner as the above for each pattern and current vectors can be obtained in bit lines as shown in FIG. 12.

For example, if the pattern '4' of FIG. 11 is learned by a neural network of the embodiment that the upper and lower word lines 30 and 40 are composed of 784 and that the bit lines 10 are composed of 4, first, 28×28 pixel voltages of the pattern '4' are read and decomposed into a one-dimensional voltage vector having 784 components (e.g., 0.0, 0.0, 0.1, 0.2, 0.4, . . . , 0.8, 0.7, 0.5, 0.2, 0.3, 0.0, 0.0). And then the upper and lower word lines are input with the voltage vector components (0.0, 0.0, 0.1, 0.2, 0.4, . . . , 0.8, 0.7, 0.5, 0.2, 0.3, 0.0, 0.0) and the opposite polarity voltage vector components (0.0, 0.0, −0.1, −0.2, −0.4, . . . , −0.8, −0.7, −0.5, −0.2, −0.3, 0.0, 0.0), respectively, in a state that the four bit lines are grounded.

By repeating the learning for the same pattern '4' in this way, the learned result is stored in a 4×784 conductance matrix (G) of the resistive memory devices. After that, when the pattern '4' is put to the neural network according to the embodiment, the pixel voltages of the pattern are decomposed into a one-dimensional voltage vector in the same manner as in the learning and applied to the upper and lower word lines, the current vector (I) having four components in the grounded bit lines is obtained. As the result, the pattern '4' is recognized as [0100] in FIG. 12.

The other patterns in FIG. 11 are also recognized as the current vector (I) represented by the corresponding four digital components in FIG. 12. That is, pattern '0' is [0000], pattern '1' is [0001], pattern '2' is [0010], pattern '3' is [0011], pattern '5' is [0101], pattern '6' is [0110], pattern '7' is [0111], pattern '8' is [1000], and pattern '9' is [1001].

What is claimed is:

1. A neural network composed of a plurality of synaptic devices, wherein:

the neural network has a cross-point array vertically stacked with a plurality of conductive lines intersecting each other, the conductive lines are stacked in three or more layers, each of the synaptic devices is configured with two resistive memory devices arranged symmetrically with one of the conductive lines disposed therebetween in the vertical direction, each of the two resistive memory devices comprises one or more resistance change material layers between the conductive lines intersecting up and down, and the resistance change material layers comprise a silicon nitride film and a silicon oxide film stacked on an upper or a lower portion of the silicon nitride film.

2. The neural network composed of a plurality of synaptic devices, wherein:

the neural network has a cross-point array vertically stacked with a plurality of conductive lines intersecting each other, the conductive lines are stacked in three or more layers, each of the synaptic devices is configured with two resistive memory devices arranged symmetrically with one of the conductive lines disposed therebetween in the vertical direction, the conductive lines are divided into three layers of a lower layer, an intermediate layer and an upper layer, a plurality of lower word lines are arranged in the lower layer, a plurality of bit lines are arranged to be perpendicular to the lower word lines in the intermediate layer, a plurality of upper word lines are arranged in parallel with the lower word lines in the upper layer, each of the two resistive memory devices comprises one or more resistance change material layers between the conductive lines intersecting up and down, and the resistance change material layers comprise a silicon nitride film and a silicon oxide film stacked on an upper or a lower portion of the silicon nitride film.

3. A pattern readout method of a neural network composed of a plurality of synaptic devices, wherein the neural network has a cross-point array vertically stacked with a plurality of conductive lines intersecting each other, the conductive lines are stacked in three or more layers, each of the synaptic devices is configured with two resistive memory devices arranged symmetrically with one of the conductive lines disposed therebetween in the vertical direction, the conductive lines are divided into three layers of a lower layer, an intermediate layer and an upper layer, a plurality of lower word lines are arranged in the lower layer, a plurality of bit lines are arranged to be perpendicular to the lower word lines in the intermediate layer, a plurality of upper word lines are arranged in parallel with the lower word lines in the upper layer, the synaptic devices are resistive memory devices having top and bottom electrodes, the top and bottom electrodes being the conductive lines intersecting up and down, and the resistive memory devices comprise one or more resistance change material layers between the conductive lines intersecting up and down, the method comprising steps of:

inputting each of the upper word lines as a voltage vector component;

inputting each of the lower word lines as an opposite polarity voltage vector component having the same magnitude as the voltage vector component applied to each of the upper word lines connected in a stack of the resistive memory devices; and reading the bit lines and outputting a current vector to recognize a predetermined pattern, the current vector being obtained by an inner product multiplying a conductance matrix of the resistive memory devices constituting the synaptic devices by a voltage vector constituted by the voltage vector component.

4. The method of claim 3, wherein the resistance change material layers comprise a silicon nitride film and at least one of a silicon oxide film, an aluminum oxide film and a hafnium oxide film stacked on an upper or a lower portion of the silicon nitride film.

5. The method of claim 4, wherein voltages of pixels constituting the pattern are decomposed into a one-dimensional voltage vector, the one-dimensional voltage vector applying to each of the upper word lines as the voltage vector component, wherein each of the lower word lines is applied with an opposite polarity voltage vector component having the same magnitude as the voltage vector component applied to each of the upper word lines connected in a stack of the resistive memory devices, wherein the bit lines are grounded for learning to effect conductance of the resistive memory devices constituting the synaptic devices, and wherein the result of the learning is reflected in the conductance matrix of the resistive memory devices.

6. The method of claim 3, wherein voltages of pixels constituting the pattern are decomposed into a one-dimensional voltage vector, the one-dimensional voltage vector applying to each of the upper word lines as the voltage vector component, wherein each of the lower word lines is applied with an opposite polarity voltage vector component having the same magnitude as the voltage vector component applied to each of the upper word lines connected in a stack of the resistive memory devices, wherein the bit lines are grounded for learning to effect conductance of the resistive memory devices constituting the synaptic devices, and wherein the result of the learning is reflected in the conductance matrix of the resistive memory devices.

* * * * *